US007620507B2

(12) United States Patent
Richardson

(10) Patent No.: US 7,620,507 B2
(45) Date of Patent: Nov. 17, 2009

(54) IMPEDANCE-ESTIMATION METHODS, MODELING METHODS, ARTICLES OF MANUFACTURE, IMPEDANCE-MODELING DEVICES, AND ESTIMATED-IMPEDANCE MONITORING SYSTEMS

(75) Inventor: John G. Richardson, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 33 days.

(21) Appl. No.: 11/753,214

(22) Filed: May 24, 2007

(65) Prior Publication Data

US 2008/0294358 A1 Nov. 27, 2008

(51) Int. Cl.
*G01R 15/00* (2006.01)
(52) U.S. Cl. .................................................. 702/57
(58) Field of Classification Search .................. 702/57, 702/65, 75; 324/237, 238, 600
See application file for complete search history.

(56) References Cited

U.S. PATENT DOCUMENTS

| 6,965,836 | B2 | 11/2005 | Richardson | |
|---|---|---|---|---|
| 7,088,115 | B1 * | 8/2006 | Glenn et al. | 324/691 |
| 7,419,487 | B2 * | 9/2008 | Johnson et al. | 606/41 |
| 7,481,913 | B2 * | 1/2009 | Kawase et al. | 204/406 |

OTHER PUBLICATIONS

"Resistance and Impedance in AC Circuit Tutorial", pp. 1-2, printed Mar. 23, 2009.*

* cited by examiner

*Primary Examiner*—Michael P Nghiem
(74) *Attorney, Agent, or Firm*—TraskBritt PC

(57) ABSTRACT

An impedance estimation method includes measuring three or more impedances of an object having a periphery using three or more probes coupled to the periphery. The three or more impedance measurements are made at a first frequency. Three or more additional impedance measurements of the object are made using the three or more probes. The three or more additional impedance measurements are made at a second frequency different from the first frequency. An impedance of the object at a point within the periphery is estimated based on the impedance measurements and the additional impedance measurements.

31 Claims, 5 Drawing Sheets

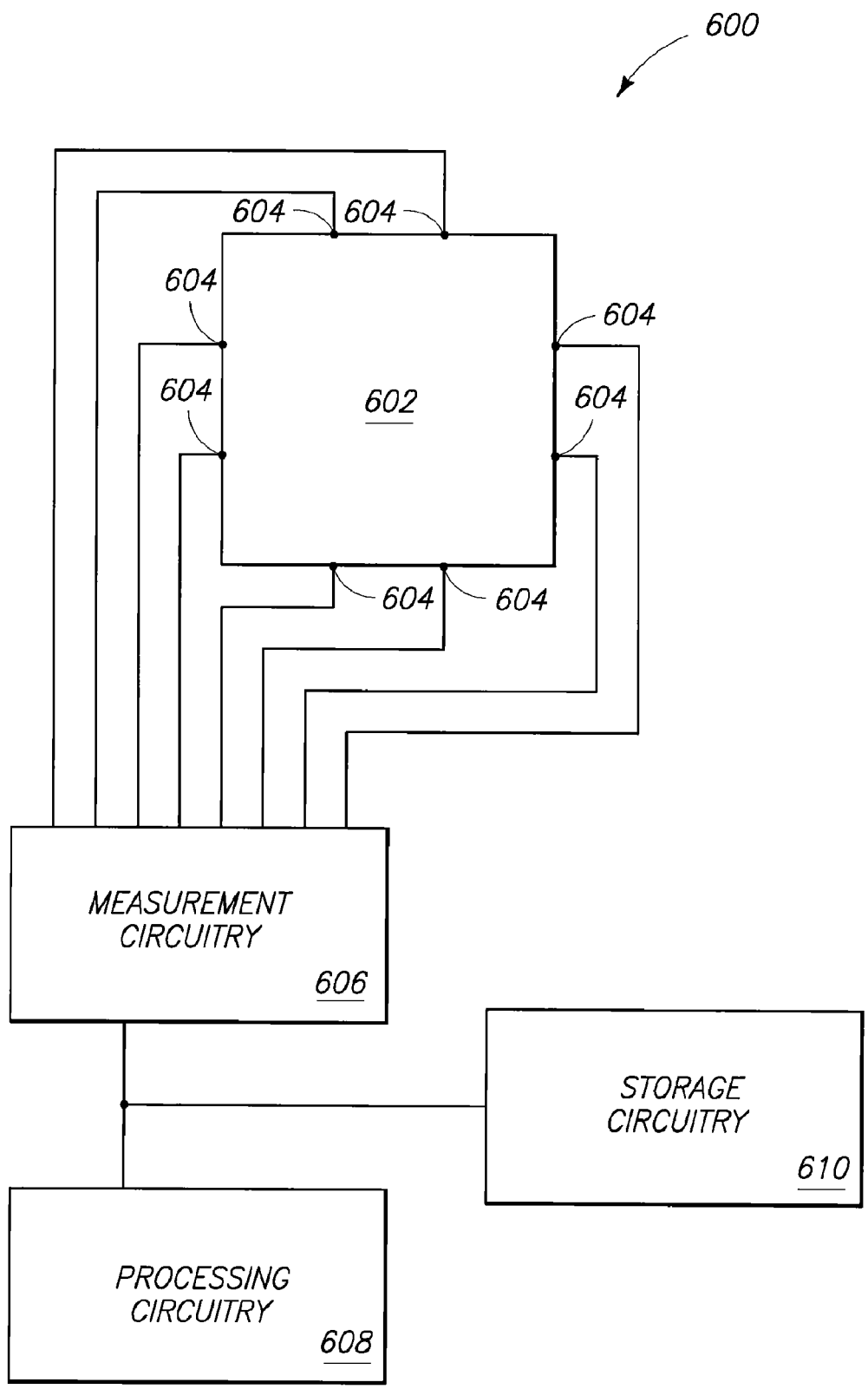

US 7,620,507 B2

IMPEDANCE-ESTIMATION METHODS, MODELING METHODS, ARTICLES OF MANUFACTURE, IMPEDANCE-MODELING DEVICES, AND ESTIMATED-IMPEDANCE MONITORING SYSTEMS

CONTRACTUAL ORIGIN OF THE INVENTION

This invention was made with goverment support under Contract No. DE-AC07-05ID14517 awarded by the United States Department of Energy. The government has certain rights in the invention.

TECHNICAL FIELD

The present invention relates to impedance estimation methods, modeling methods, articles of manufacture, impedance-modeling devices, and estimated-impedance monitoring systems.

BACKGROUND OF THE INVENTION

Structures and the materials comprised by those structures are often evaluated for integrity and other physical properties using a variety of nondestructive evaluation techniques. These techniques include thermographic, optical, acoustic, radiographic (e.g., x-ray), and electromagnetic procedures.

Resistivity measurements may be helpful in evaluating the integrity of some materials since the resistivity of a surface may correlate to other physical phenomena, such as strain on the surface, thermal characteristics of the surface, photosensitivity of the surface, and physical integrity of the surface. However, many materials are non-conductive, or have very high resistivity. Consequently, the use of resistivity measurements to monitor the physical integrity of these materials may be ineffective.

SUMMARY OF THE INVENTION

One aspect of the invention relates to an impedance estimation method that includes measuring three or more impedances of an object having a periphery using three or more probes coupled to the periphery. The three or more impedance measurements are made at a first frequency. The method also includes measuring three or more additional impedances of the object using the three or more probes. The three or more additional impedance measurements are made at a second frequency that is different from the first frequency. The method also includes estimating an impedance of the object at a point within the periphery based on the impedance measurements made at the first frequency and the impedance measurements made at the second frequency.

Another aspect of the invention relates to a modeling method that includes positioning a plurality of probes proximate a periphery of an object and grouping the plurality of probes into one or more pairs. The individual pairs consist of a unique combination of two of the probes. For individual pairs, an impedance is measured between the two probes of the individual pair at a first frequency and an impedance is measured between the two probes of the individual pair at a second frequency. The method also includes, for individual pairs, determining a lumped-parameter impedance model for a straight line extending between the two probes of the individual pair based on the measured impedances. The lumped-parameter impedance model includes a capacitance value and a resistance value.

Another aspect of the invention relates to an article of manufacture including media that includes programming configured to cause circuitry to perform processing that includes, for individual pairs of a plurality of probes, determining a lumped-parameter impedance model for the individual pair based on measurements of impedance between the probes. The probes are coupled to a periphery of a near-planar sheet of matter and the individual pairs consist of a unique combination of two of the probes. The processing also includes estimating an impedance of the near-planar sheet of matter at a point within the periphery based on the lumped-parameter impedance models.

According to another aspect of the invention, an impedance-modeling device includes measurement circuitry and processing circuitry. The measurement circuitry is configured to couple to a plurality of probes positioned proximate a periphery of a near-planar sheet of matter and is further configured to measure impedances between pairs of the probes. Individual pairs of the probes consist of a unique combination of two of the probes.

The processing circuitry is configured to determine, for individual pairs, a lumped-parameter impedance model for a straight line extending between the two probes of the individual pair based on impedance measurements made by the measurement circuitry. The processing circuitry is further configured to estimate an impedance of the near-planar sheet of matter at a point within the periphery based on the lumped-parameter impedance models.

BRIEF DESCRIPTION OF THE DRAWINGS

Preferred embodiments of the invention are described below with reference to the following accompanying drawings.

FIG. 6 is a block diagram of a system for estimating impedances of an object.

DETAILED DESCRIPTION OF THE INVENTION

Figure 1:
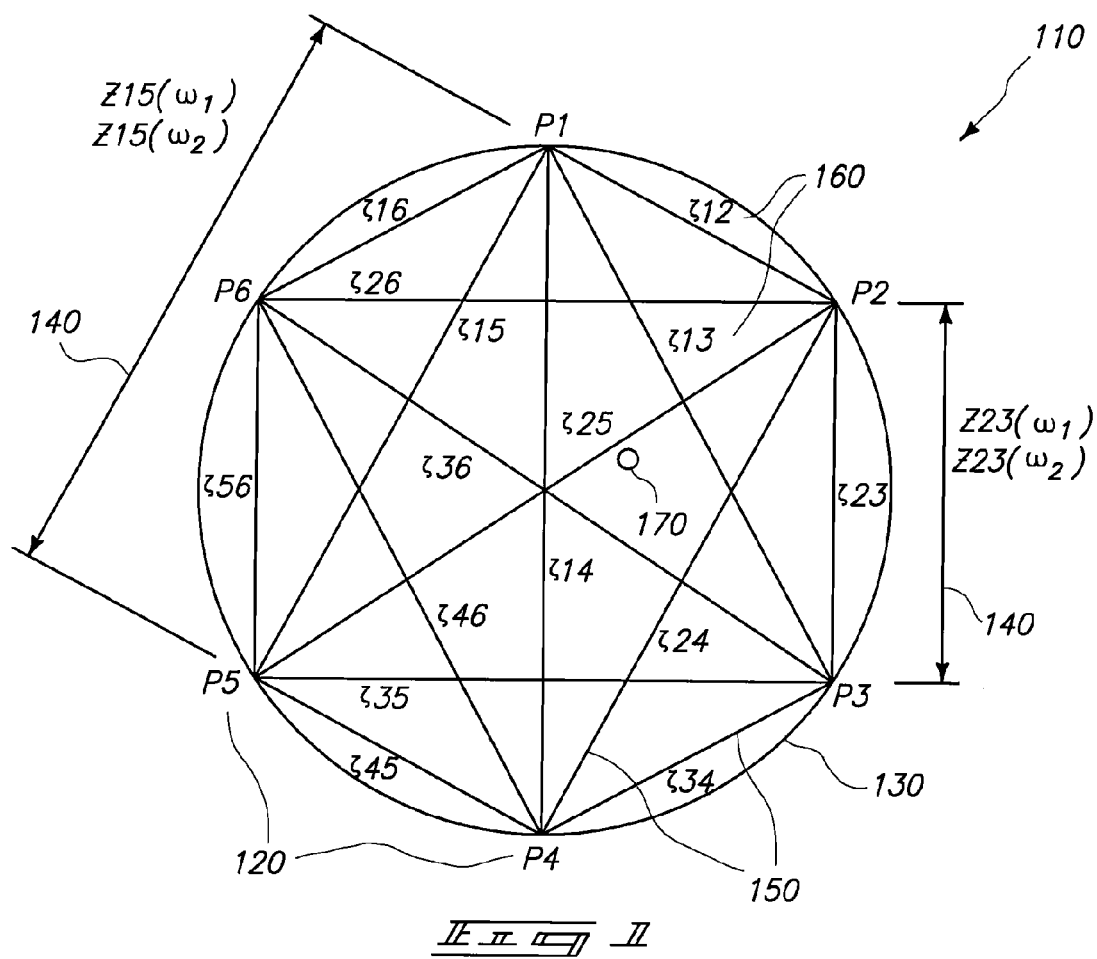
FIG. 1 is a diagram of a circular object indicating probe locations and measurement lines on the object.

One aspect of the invention relates to an impedance-estimation method that includes measuring three or more impedances of an object having a periphery using three or more probes coupled to the periphery. The object may have a near-planar, sheet-like geometry. The three or more impedance measurements are made at a first frequency.

The method also includes measuring three or more additional impedances of the object using the three or more probes. The three or more additional impedance measurements are made at a second frequency, which is different from the first frequency. Either the first frequency or the second frequency may be zero Hertz.

The probes may be in conductive contact with the object. Additionally or alternatively, the probes may be capacitively coupled to the object. In some cases, the object may be non-conductive or highly resistive. In other words, the object may have a bulk resistivity that is so high that a dynamic range of a typical measuring device may prohibit detection of abnormalities in the object since the abnormalities may create changes in resistivity that are small relative to the high bulk resistivity. However, despite being non-conductive or highly resistive, the bulk impedance of the object as well as changes in impedance may be readily measurable.

The method also includes estimating an impedance of the object at a point within the periphery based on the impedance measurements made at the first frequency and the impedance measurements made at the second frequency.

To estimate the impedance at the point, the method may further include grouping the three or more probes into three or more pairs. Individual pairs consist of a unique combination of two of the probes. The method may include determining a lumped-parameter impedance model for the individual pairs for a straight line extending between the two probes of the individual pair.

The lumped-parameter impedance model may be based on the impedance measurements made at the first frequency and the impedance measurements made at the second frequency and may include a capacitance value and a resistance value. The lumped-parameter model may include a resistor and a capacitor connected in parallel. Alternatively, the lumped-parameter model may include a resistor and a capacitor connected in series.

Since the point for which capacitance is being estimated might not be intersected by any straight line connecting two of the probes, estimating impedance at the point may further include determining orthogonal distances from the point to three or more of the straight lines encompassing the point. A weighted average of impedance values of the lumped-parameter impedance models associated with the three or more straight lines is then calculated. The impedance values of the lumped-parameter impedance models are weighted respectively by the orthogonal distances.

In some cases, the method may include estimating a dielectric permittivity of the object at the point based, at least in part, on the impedance measurements made at the first frequency and the impedance measurements made at the second frequency.

FIG. 1 illustrates an example circular object 110 configured for impedance estimation in accordance with one or more aspects of the invention described herein. Object 110 may be a near-planar sheet of matter. As illustrated by FIG. 1, a plurality of probe locations 120 may be positioned around the periphery 130 of object 110. The number of probe locations 120 is related to the accuracy with which impedance may be estimated. Accordingly, the larger the number of probes, the more accurate the impedance estimate.

Probe locations 120 may be selected in a manner allowing one or more areas of interest, where property analysis is desired, to be encompassed within a boundary defined by line segments extending between each of the adjacent probe locations 120. For example, in FIG. 1, with N=6 probe locations 120, the boundary is defined by six line segments (i.e., line segment P1-P2, line segment P2-P3, line segment P3-P4, line segment P4-P5, line segment P5-P6, and line segment P6-P1). In some cases, the shape of the boundary may be different from a shape of the periphery of the object. For example, object 110 has a circular periphery but a hexagonal boundary. In other cases, the shape of the boundary may be the same as the shape of the periphery of the object.

As a result, an analysis mesh is defined by line segments, also referred to as measurement lines 150, between each probe location 120 and all other probe locations 120 of the plurality of probe locations 120. In general, N probe locations 120 define a total of N*N measurement lines 150 between the probe points at which discrete impedance measurements may be taken. This total of N*N measurements includes measurements of impedance between a probe location and itself, which is a point rather than a line segment, and therefore need not be measured. Additionally, an impedance measurement along, for example, line segment P1-P5 will be the same when measured from P1 to P5 and from P5 to P1. So, even though it is convenient to discuss N*N discrete measurement values, only (N*(N−1))/2 actual discrete measurements are used.

A mesh, in the context of this analysis, refers to the resultant set of lines as defined above. The analysis method used in the present invention does not rely on determining property values at intersection points of measurement lines 150. Rather, it relies on measurements around periphery 130 combined with analysis and estimation using these periphery measurements without requiring determination of properties at internal intersection points.

Impedance magnitude measurements are made along measurement lines 150 at two or more different frequencies to arrive at a set of measured impedance-magnitude values 140. Measured impedance-magnitude values 140 are illustrated in FIG. 1 with a capital Z followed by the points defining the line segment along which the measurement is taken and the frequency at which the measurement is taken. For example, measurement $Z15(\omega_1)$ illustrated in the upper left portion of FIG. 1 is a measurement made between point P1 and point P5 at frequency $\omega_1$. An impedance magnitude may be measured using various techniques well known in the art. For example, a precision meter or a combination of a current source, an MOS multiplexer, a voltage amplifier, and an analog-to-digital converter may be used.

Having collected measured impedance-magnitude values 140, a lumped-parameter impedance model 160 may be determined for the analysis mesh. The measured values of impedance magnitude may form an N×N matrix $[|Z_{ij}|]$ of measured impedance-magnitude values 140. The overall sheet impedance of object 110 may be characterized as a set of lumped-parameter impedance models 160. If lumped-parameter impedance models 160 are defined between the same probe locations 120 as for the measured values of impedance magnitude, a matrix of $[|\zeta_{ij}|]$ lumped-parameter impedance models 160 may be defined.

A linear transformation, well known in the art, may be developed to define the relationship between lumped-parameter impedance models 160 and measured impedance-magnitude values 140. This relationship may be defined as a transformation matrix of coefficients F based on the physical geometries of the object and the relative placement of probe locations 120. Accordingly, measured impedance magnitude values 140 are a function of lumped-parameter impedance models 160. This may be written in matrix form as:

$$[|Z_{ij}|] = F[|\zeta_{ij}|]$$

i=1 to N j=1 to N

As a result, there are N equations and N unknowns and one may solve for the lumped-parameter impedance models 160 using linear algebra by inverting the coefficient matrix F to arrive at:

$$[|\zeta_{ij}|] = F^{-1}[|Z_{ij}|]$$

Resistivity and dielectric permittivity portions of the model may also be determined. To determine resistivity, impedance measurements may be made at a frequency of zero Hertz. The transformation is used to determine segment resistances $r_{ij}$ according to the following equation:

$$r_{ij}=F^{-1}[|Z_{ij}(\omega=0)|]$$

Alternatively, resistivity values may be determined using impedance measurements made at two different non-zero frequencies. Once resistivity values have been determined, segment capacitances $c_{ij}$ for a parallel lumped-parameter model may be determined using the following equation:

$$c_{ij}=(r_{ij}+|\zeta_{ij}|)/(\omega*r_{ij}*|\zeta_{ij}|)$$

Once segment capacitance values have been determined, dielectric permittivity values $\in_{ij}$ may be determined using the following equation:

$$\in_{ij}=c_{ij}*L_{ij}/a_{ij}$$

Where $L_{ij}$ is the length of the segment and $a_{ij}$ is the cross-sectional area of the segment, the segment being subtended by probes at both ends of the segment.

Based on the lumped-parameter impedance models 160, an estimated impedance at a point on object 110 encompassed by probe locations 120 may be determined by performing a weighted-average interpolation. The interpolation process occurs by first creating a bounded region of object 110 encompassing a selected location 170. The bounded region is defined by selecting three probe locations 120 with three measurement lines 150 between the probe locations 120 defining a triangle encompassing selected location 170. The lumped-parameter impedance models 160 for the three measurement lines 150 are used in the interpolation. The model assumes the impedance per unit length is substantially constant along a measurement line 150 such that the impedance is substantially the same at any point along the measurement line 150.

Figure 2:
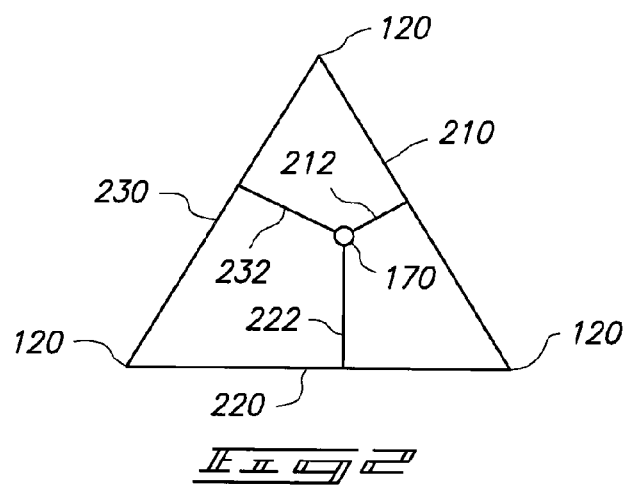
FIG. 2 is a diagram indicating measurement lines and various distances used calculating weighted averages used in determining impedance at a selected location.

To create the weightings, an orthogonal distance is determined from the three selected measurement lines 150 to selected location 170. For example, in FIG. 2, a first measurement line 210 between probe locations 120 has a first orthogonal distance 212 (also referred to as $d_{za}$) to selected location 170. A second measurement line 220 between probe locations 120 has a second orthogonal distance 222 (also referred to as $d_{zb}$) to selected location 170. Finally, a third measurement line 230 between probe locations 120 has a third orthogonal distance 232 (also referred to as $d_{zc}$) to selected location 170.

The weighted contribution of a given measurement line 150 is a function of the orthogonal distance from selected location 170 to the measurement line 150 relative to the sum of the orthogonal distances for all three measurement lines. For example, the weighted contribution for the first measurement line 210 is defined as:

$$1-d_{za}/(d_{za}+d_{zb}+d_{zc})$$

As may be seen and readily appreciated, if selected location 170 is very close to measurement line 150, the orthogonal distance for that line will be small, resulting in a large weighted contribution.

The final weighted average is computed as the admittance $(y_a, y_b, y_c)$ of the measurement line (210, 220, 230) multiplied by its corresponding weighted contribution, as defined by:

$$y_z=y_c\{1-d_{zc}/(d_{za}+d_{zb}+d_{zc})\}+y_b\{1-d_{zb}/(d_{za}+d_{zb}+d_{zc})\}+y_a\{1-d_{za}/(d_{za}+d_{zb}+d_{zc})\}$$

Or in more general form:

$$y_z=\Sigma_{(i=1\ to\ N)}\{1-d_{zi}/\Sigma_{(j=1\ to\ N)}d_{zj}\}y_i$$

Admittance, which is the inverse of impedance, is used in the above equation instead of impedance to simplify the equation.

Figure 3:
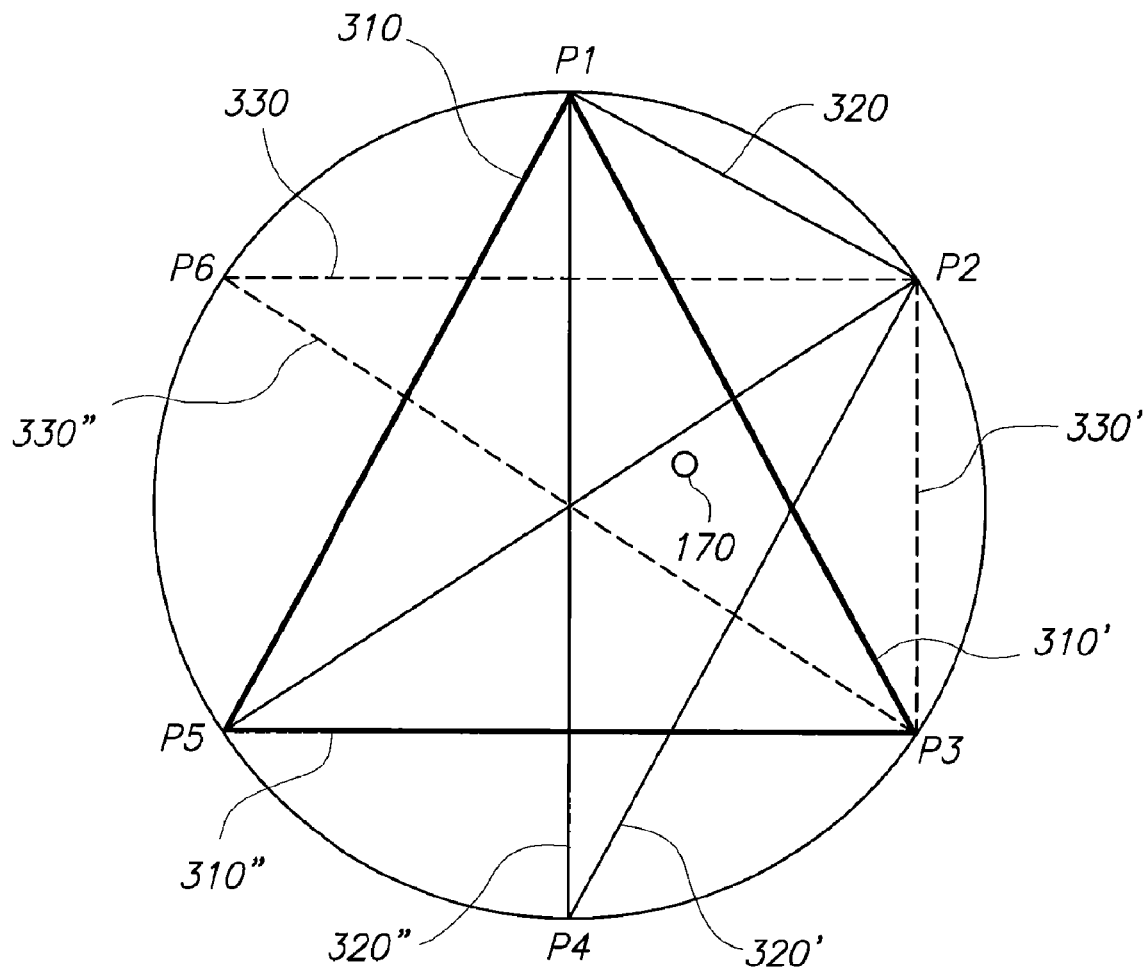
FIG. 3 is a diagram depicting various analysis triangles that may be used in a weighted average analysis to determine impedance at a selected location.

For most geometries comprising a relatively large number of probe locations 120, many different bounding triangles may be defined. As an example, FIG. 3 illustrates three different bounding triangles encompassing selected location 170. A first triangle is defined by the first triangle measurement lines (310, 310', 310") between probe locations P1, P3, and P5; a second triangle is defined by the second triangle measurement lines (320, 320', 320") between probe locations P1, P2, and P4; and a third triangle is defined by the third triangle measurement lines (330, 330', 330") (shown in dashed lines) between probe locations P2, P3, and P6.

Other possible bounding triangles are not illustrated. A more accurate overall weighted average may be possible by combining the weighted average from multiple bounding triangles. For example, all possible bounding triangles may be combined to arrive at a more accurate overall weighted average. Alternatively, an analysis of most likely candidates may be used to identify bounding triangles that may produce the most accurate results. For example, an analysis may select bounding triangles with a combined orthogonal distance (i.e., $d_{za}+d_{zb}+d_{zc}$) below a predetermined threshold. This emphasizes those bounding triangles having measurement lines 150 closest to selected location 170.

As explained above in relation to FIG. 1, with a relatively large number of probe locations 120, multiple bounding triangles are likely for any given selected location. This is an advantage because there may be anomalies in object 110. For example, discontinuities may develop due to, as examples only, punctures, tears, cracks, or other damage to the surface of the structure. The present invention may be used to locate these anomalous areas.

However, if a measurement line 150 crosses the anomalous area, the measured impedance value, and as a result the lumped-parameter impedance model 160, for that measurement line 150 may be inaccurate. The present invention may compensate for possibly inaccurate measured impedance values 140 by removing the suspect measurement line 150 from the analysis. Typically, other redundant bounding triangles will exist after removal of the suspect measurement line 150. These remaining bounding triangles may be used in the weighted-average analysis to develop a profile for locating the anomalous area.

Object 110 may be a simple geometric shape, such as, for example, the circle of FIG. 1, a square, a triangle, or an ellipse. However, the actual two-dimensional shape of the object may take on virtually any shape. For irregular shapes, probe locations 120 may need to be chosen at irregular intervals around periphery 130 to obtain suitable coverage of the analysis mesh.

Object 110 may have a near-planar geometry. In other words, object 110 may have a surface that is substantially flat. Object 110 may alternatively or additionally have a sheet-like geometry. In other words, object 110 may have a thickness that is small compared to other dimensions of object 110. For example, the methods described above may be effective when object 110 has an aspect ratio (maximum planar dimension to minimum thickness) of 10:1 or greater. However, a ratio of less than 10:1 may be effective if object 110 has a dielectric permittivity higher than about 3.

Object 110 may be non-conductive or highly resistive. Consequently, conventional resistivity measurements may be ineffective in identifying defects within object 110. However, object 110 may still have a measurable dielectric permittivity. Accordingly, impedance measurements may be used to characterize object 110.

According to a another aspect of the invention, a modeling method includes positioning a plurality of probes proximate a periphery of an object and grouping the plurality of probes into one or more pairs. The individual pairs consist of a unique combination of two of the probes. Each probe of the plurality may be paired with every other probe of the plurality. Consequently, the plurality of probes may consist of N probes and the number of probe pairs may be $(N*(N-1))/2$.

For individual pairs, an impedance is measured between the two probes of the individual pair at a first frequency. Measuring the impedance may include measuring a magnitude of the impedance. An impedance is also measured between the two probes of the individual pair at a second frequency.

The method also includes, for individual pairs, determining a lumped-parameter impedance model for a straight line extending between the two probes of the individual pair based on the measured impedances. The lumped-parameter impedance model includes a capacitance value and a resistance value. A dielectric permittivity value may be determined for the individual pair based on the capacitance value and resistance value of the individual pair.

The method may also include estimating an impedance value for a point within the periphery by determining orthogonal distances from the point to three or more of the straight lines extending between the probe pairs. The three or more of the straight lines encompass the point. The method further includes calculating a weighted average of impedance values of the lumped-parameter impedance models associated with the three or more straight lines. The impedance values of the lumped-parameter impedance models are weighted respectively by the orthogonal distances.

The impedance of the object may be expected to be approximately homogeneous throughout the surface of the object. Consequently, it may be advantageous to identify points of the object that have an impedance value that is much different from other points of the object due to, for example, a defect in the object.

Accordingly, the method may also include estimating additional impedance values for individual points of a plurality of additional points within the periphery and identifying at least one of the additional estimated impedance values that is outside of a range associated with a mean of the estimated impedance value and the additional estimated impedance values.

Figure 4:
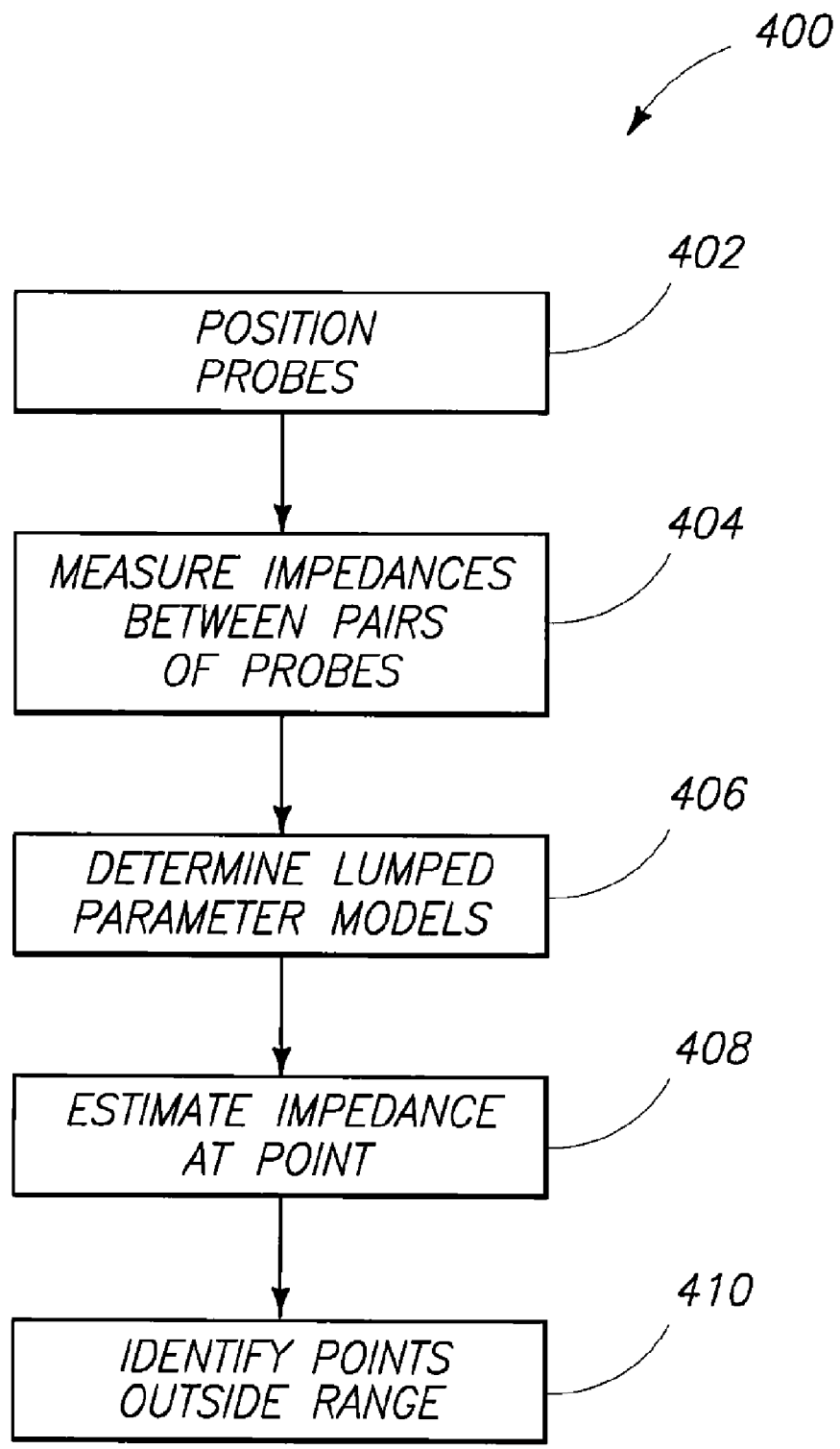
FIG. 4 is a flow chart illustrating an impedance-estimation method.

FIG. 4 shows a flow chart illustrating a method 400 of estimating impedance at a plurality of points of an object having approximately homogeneous impedance. At 402, probes are positioned around the periphery of an object. The probes may be conductively and/or capacitively coupled to the object. At 404, impedances are measured between pairs of the probes, for example in the manner described above in relation to FIG. 1. At 406, lumped-parameter models are determined for each pair of probes based on the measured impedances.

At 408, impedance values are estimated for the plurality of points based on the lumped-parameter models by performing weighted averaging, for example, as was described above in relation to FIGS. 2-3.

At 410, points of the plurality of points for which the estimated impedance is outside of a range are identified. The range may be a set of accepted impedance values. In other words, if an estimated impedance value for a point is within the range, the point is not considered defective.

The range may be based on a mean of the estimated impedance values of the plurality of points. For example, a mean of the estimated impedance values of the plurality of points may be calculated. The range may then be chosen to symmetrically surround the mean value. For example, the range could include impedance values one standard deviation away from the mean on either side of the mean.

Once the range has been selected, points of the plurality of points having estimated impedance values that are not within the range may be identified. For example, if the range is one standard deviation on either side of the mean, and the estimated impedance value for a particular point is more than one standard deviation from the mean, the estimated impedance value for the particular point is outside of the range.

In some cases, it may be advantageous to compare, for a particular point, an estimated impedance value based on impedance measurements made at one moment in time to another estimated impedance value based on impedance measurements made at a later moment in time. Such a comparison may enable detection of changes in impedance due to, for example, the object being physically damaged at or near the particular point.

In these cases, the method may include, for individual pairs, measuring a second impedance between the two probes of the individual pair at the first frequency and measuring a second impedance between the two probes of the individual pair at the second frequency, the second impedance measurements being made later in time than the first impedance measurements.

The method may further include identifying one of the second impedance measurements that is outside of a range associated with the first impedance measurement performed at a same frequency and for a same pair as the second impedance measurement.

The method may further include estimating a first impedance value for a point within the periphery based on the first impedance measurements, estimating a second impedance value for the point based on the second impedance measurements, and determining that the second estimated impedance value is outside of a range associated with the first estimated impedance value.

It may be desirable to trigger the second impedance measurement after an event. For example, if the invention is included on an aircraft wing, it may be desirable to trigger a new measurement after an accelerometer output reaches certain parameters. For a storage tank, a new measurement may be taken when stored material within the tank is at a certain level. Pressure and temperature measurements may also be used to trigger a measurement. Alternatively, or in addition to triggering a measurement responsive to a sensed event, measurements may be taken at various times, for example periodically.

Figure 5:
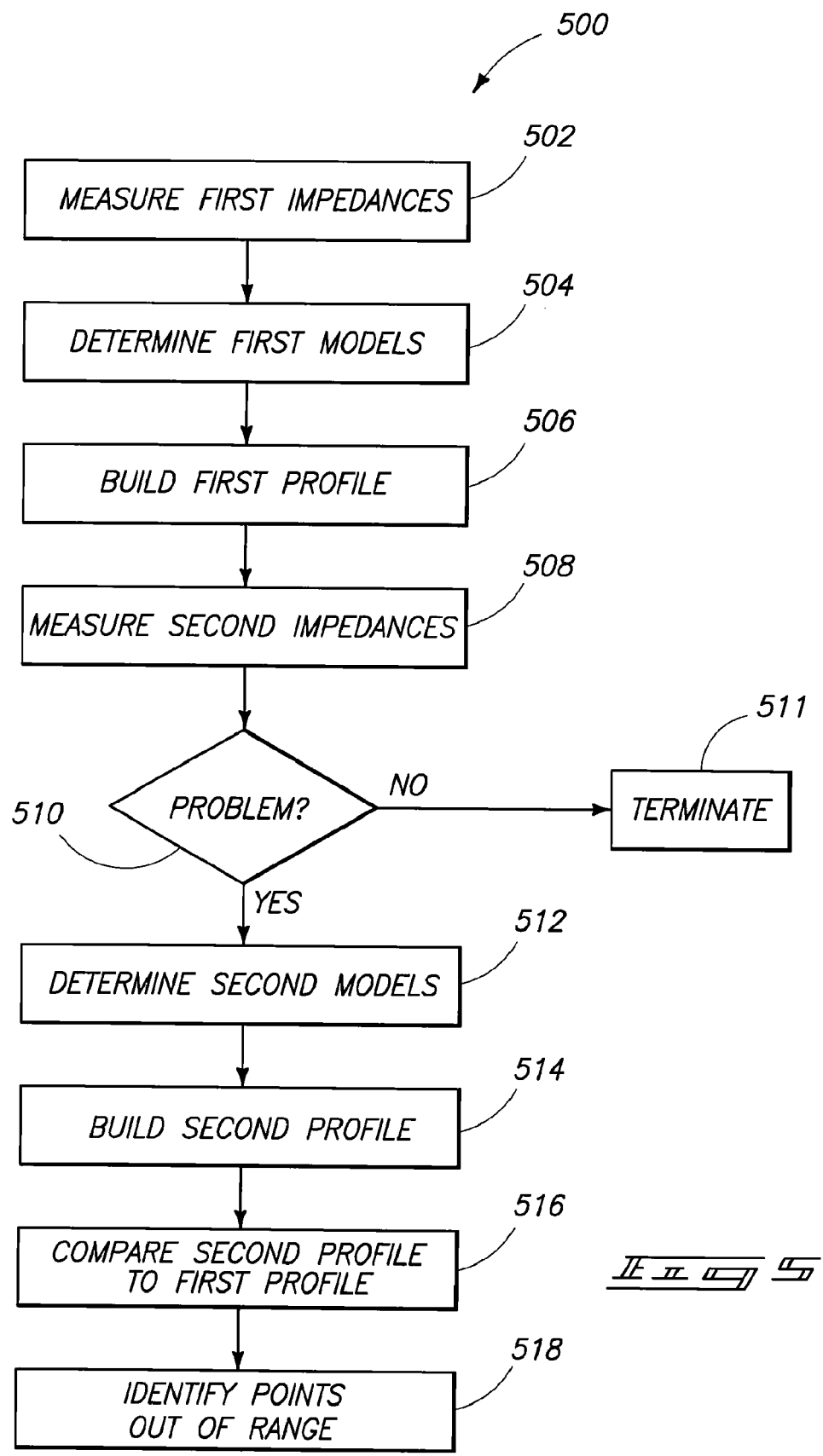
FIG. 5 is a flow chart illustrating an estimated-impedance monitoring method.

FIG. 5 shows a flow chart illustrating a method 500 of comparing a first estimated impedance for a point to a second estimated impedance for the point. At 502, first impedances are measured between the pairs of probes as was discussed above in relation to FIG. 1. Next, at 504, lumped-parameter models are determined for the pairs of probes based on the first measured impedances. A first impedance profile of the object is then built at 506 by estimating an impedance value at each of a plurality of points within the periphery of the object based on a weighted average of the lumped-parameter models.

At a point in time subsequent to the time the first impedances were measured, a second set of impedances are measured between the pairs of the probes at 508. At this point, a comparison may be made between the first impedance measurements and the second impedance measurements.

At 510, if none of the second impedance measurements is outside of a range associated with corresponding first impedance measurements, the method may terminate at 511 since the second measurements may be considered acceptable. The range may be selected using a number of techniques. For example, the range may be the first impedance measurement plus or minus a percentage of the first impedance measurement. Alternatively, the range may be a mean of a plurality of previous impedance measurements for a particular probe pair plus or minus a standard deviation.

At 512, if one or more of the second impedance measurements are outside of the range, lumped-parameter models are determined based on the second impedance measurements. At 514, a second profile is constructed for the object by estimating the impedance at the same plurality of points as the first impedance profile using weighted averaging of the lumped-parameter models. At 516, the first profile and second profile are compared point by point. At 518, points of the second profile that are outside of a range with respect to the first profile are identified.

Method 500 advantageously identifies points of an object that are outside of a range with respect to estimated impedance. Knowing which points of an object are outside of a range with respect to an estimated impedance value may be useful in pinpointing the location of a defect in the object since some defects that affect the integrity of the object may not be readily visible to the human eye. This may be especially relevant to defects that may affect the dielectric permittivity of the object but not the resistivity of the object.

Method 500 could alternatively or additionally be used to compare a first estimated resistivity and/or dielectric permittivity for a point to a second estimated resistivity and/or dielectric permittivity for the point. This may be accomplished by building a resistivity profile and/or a dielectric permittivity profile by estimating a resistivity value and/or a dielectric permittivity value at each of the plurality of points based on a weighted average of the lumped-parameter models.

While the analysis is two-dimensional, and an object may be applied to an essentially two-dimensional structure, the analysis is not limited to two-dimensional structures. The object may be applied to curved surfaces or across a plurality of surfaces comprising a three-dimensional structure. In this situation, the object might no longer be near planar. The techniques described above may be used to estimate impedance at a point, monitor impedance over time, and so on. However, in determining lumped-parameter models, different equations may be used that account for the dielectric permittivity of the structure on which the object is overlaid. Thus, the object may be attached to various structures such as, by way of example, storage vessels, ship hulls, aircraft wings, spacecraft wings, turbine blades, body armor on military combat tanks, personal body armor, and vehicle axles.

According to another aspect of the invention, an impedance-modeling device includes measurement circuitry and processing circuitry. The measurement circuitry is configured to be coupled to a plurality of probes positioned proximate a periphery of a near-planar sheet of matter and is further configured to measure impedances between pairs of the probes. Individual pairs of the probes consist of a unique combination of two of the probes.

The processing circuitry is configured to determine, for individual pairs, a lumped-parameter impedance model for a straight line extending between the two probes of the individual pair based on impedance measurements made by the measurement circuitry. The processing circuitry is further configured to estimate an impedance of the near-planar sheet of matter at a point within the periphery based on the lumped-parameter impedance models.

The processing circuitry may be configured to calculate a weighted average of impedance values of the lumped-parameter impedance models associated with three or more of the straight lines. The three or more of the straight lines may encompass the point and the impedance values of the lumped-parameter impedance models may be weighted respectively by orthogonal distances from the point to the three or more straight lines.

An estimated-impedance monitoring system may include the impedance-modeling device, the near-planar sheet of matter, and the plurality of probes configured to measure impedance and configured to be positioned proximate the periphery. The processing circuitry may be further configured to estimate a second impedance of the near-planar sheet of matter at the point within the periphery, based on a second set of impedance measurements provided by the measurement circuitry.

The measurement circuitry measures the second set of impedance measurements after measuring the impedances on which the first estimated impedance is based. The processing circuitry may be further configured to determine whether the second impedance estimate is outside of a range associated with the first impedance estimate.

FIG. 6 illustrates such a system 600. System 600 includes a near-planar sheet of matter 602 and probes 604 positioned on the periphery of near-planar sheet of matter 602. Probes 604 are connected to measurement circuitry 606. Measurement circuitry 606 is configured to measure impedance between pairs of the probes and provide the measurements to processing circuitry 608.

Alternatively, measurement circuitry 606 may provide the measurements to storage circuitry 610. In this case, processing circuitry 608 may retrieve the measurements from storage circuitry 610.

Measurement circuitry 606 may include a multiplexer configured to select any two of probes 604 for making an impedance magnitude measurement. After making an impedance magnitude measurement, the multiplexer may be switched to a different pair of probes 604 to make an additional measurement. Measurement circuitry 606 may also sample a value on a currently selected pair of probes 604 and convert the sample from an analog signal to a digital value.

Processing circuitry 608 determines lumped-parameter impedance models and an estimated impedance of the near-planar sheet of matter 602 at a point within the periphery of the near-planar sheet of matter 602. Processing circuitry 608 may also compare estimated impedance values and identify points that are not within a range.

Processing circuitry 608 may comprise circuitry configured to implement desired programming provided by appropriate media. For example, processing circuitry 608 may be implemented as one or more of a processor and/or other structure configured to execute executable instructions including, for example, software and/or firmware instructions, and/or hardware circuitry. Examples of processing circuitry include hardware logic, a programmable gate array, a field programmable gate array, an application specific integrated circuit, state machines, and/or other structures alone or in combination with a processor. These examples of processing circuitry are for illustration and other configurations are possible.

In some cases, processing circuitry 608 may be a portable device that may be used with a number of different sets of probes, such as probes 604. For example, a plurality of near-planar sheets of matter 602 may be located in different locations. Individual near-planar sheets may have probes connected to the individual near-planar sheet in a permanent or semi-permanent manner. A portable version of processing circuitry 608 may be transported to the different locations and connected to the permanent or semi-permanent probes to conduct analysis. In this manner, a single version of processing circuitry 608 may be used for a plurality of different near-planar sheets of matter.

In other cases, processing circuitry 608 and probes 604 may form a system. In these cases, near-planar sheets of matter may be brought to the system for analysis. In this manner, processing circuitry 608 and probes 604 may be re-used for a plurality of different near-planar sheets of matter.

Another aspect of the invention relates to an article of manufacture including media that includes programming configured to cause circuitry to perform processing that includes, for individual pairs of a plurality of probes, determining a lumped-parameter impedance model for the individual pair based on measurements of impedance between the probes. The probes are coupled to a periphery of a near-planar sheet of matter and the individual pairs consist of a unique combination of two of the probes. The processing also includes estimating an impedance of the near-planar sheet of matter at a point within the periphery based on the lumped-parameter impedance models. The processing may estimate an impedance using one or more of the methods described above in relation to FIGS. 1-5.

The programming may be embodied in any computer program product(s) or article of manufacture(s), which can contain, store, or maintain programming, data, and/or digital information for use by or in connection with an instruction execution system including processing circuitry. For example, processor-usable media may be physical media such as electronic, magnetic, optical, electromagnetic, infrared, or semiconductor media. Some more specific examples of article of manufacture including media that includes programming include, but are not limited to, a portable magnetic computer diskette (such as a floppy diskette), zip disk, hard drive, random access memory, read only memory, flash memory, cache memory, and/or other configurations capable of storing programming, data, or other digital information.

In some cases, the programming may be software stored on a hard drive. The software may be configured to execute on a microprocessor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An impedance estimation method comprising:
 measuring three or more impedances of an object having a periphery using three or more probes coupled to the periphery, the three or more impedance measurements being made responsive to a signal applied between at least two of the three or more probes at a first frequency;
 measuring three or more additional impedances of the object using the three or more probes, the three or more additional impedance measurements being made responsive to the signal applied between at least two of the three or more probes at a second frequency different from the first frequency; and
 estimating an impedance of the object at a point within the periphery based on the impedance measurements and the additional impedance measurements.

2. The method of claim 1, further comprising:
 grouping the three or more probes into three or more pairs, each pair consisting of a unique combination of two of the probes; and
 wherein the estimating the impedance at the point comprises:
  for each pair, determining a lumped-parameter impedance model for a straight line extending between the two probes of the pair based on the impedance measurements and the additional impedance measurements, the lumped-parameter impedance model including a capacitance value and a resistance value;
  determining orthogonal distances from the point to three or more of the straight lines, the three or more of the straight lines encompassing the point; and
  calculating a weighted average of impedance values of the lumped-parameter impedance model associated with each pair, the impedance values of the lumped-parameter impedance model associated with each pair being weighted respectively by the orthogonal distances.

3. The method of claim 1, further comprising estimating a dielectric permittivity of the object at the point based at least in part on the impedance measurements and the additional impedance measurements.

4. The method of claim 1, wherein the three or more probes are in conductive contact with the object.

5. The method of claim 1, wherein the three or more probes are capacitively coupled to the object.

6. The method of claim 1, wherein the object is non-conductive.

7. The method of claim 1, wherein the first frequency is zero Hertz.

8. The method of claim 1, wherein the point is not intersected by any straight line connecting two of the probes.

9. The method of claim 1, wherein the object has a near-planar, sheet-like geometry.

10. A modeling method comprising:
 positioning a plurality of probes proximate a periphery of an object;
 grouping the plurality of probes into one or more pairs, each pair consisting of a unique combination of two of the probes;
 using each pair, measuring an impedance between the two probes of the pair responsive to a signal applied between at least two of the three or more probes at a first frequency and measuring an impedance between the two probes of the pair at a second frequency of the signal; and
 for each pair, determining a lumped-parameter impedance model for a straight line extending between the two probes of the pair based on the measured impedances, the lumped-parameter impedance model including a capacitance value and a resistance value.

11. The method of claim 10, further comprising for each pair, determining a dielectric permittivity value for the pair based on the capacitance value and resistance value of the pair.

12. The method of claim 10, wherein the one or more pairs comprises at least three pairs and the straight lines associated with the at least three pairs encompass a point, and further comprising estimating an impedance value for the point by:

determining orthogonal distances from the point to the straight line associated with each pair; and calculating a weighted average of impedance values of the lumped-parameter impedance model associated with each pair, the impedance values of the lumped-parameter impedance model associated with each pair being weighted respectively by the orthogonal distances.

13. The method of claim 12, further comprising:

estimating additional impedance values for individual points of a plurality of additional points within the periphery; and identifying at least one of the additional estimated impedance values that is outside of a range associated with a mean, the mean being the mean of the estimated impedance value and the additional estimated impedance values.

14. The method of claim 10, wherein:

the impedance measurements for each pair comprise first impedance measurements; and further comprising for each pair, measuring a second impedance between the two probes of the pair at the first frequency and measuring a second impedance between the two probes of the pair at the second frequency, the second impedance measurement being made later in time than the first impedance measurements.

15. The method of claim 14, further comprising identifying one of the second impedance measurement associated with each pair that is outside of a range associated with the first impedance measurement performed at a same frequency as the first impedance measurement.

16. The method of claim 14, further comprising:

estimating a first impedance value for a point within the periphery based on the first impedance measurements;

estimating a second impedance value for the point based on the second impedance measurements; and determining that the second estimated impedance value is outside of a range associated with the first estimated impedance value.

17. The method of claim 10, wherein the object has a near-planar, sheet-like geometry.

18. The method of claim 10, wherein each probe of the plurality is paired with every other probe of the plurality.

19. The method of claim 10, wherein the plurality of probes consists of n probes and the number of probe pairs is (n*(n−1))/2.

20. The method of claim 10, wherein the lumped-parameter models individually comprise a resistor and a capacitor connected in parallel.

21. The method of claim 10, wherein the lumped-parameter models individually comprise a resistor and a capacitor connected in series.

22. The method of claim 10, wherein the measuring the impedance comprises measuring a magnitude of the impedance.

23. The method of claim 10, wherein the probes are in conductive contact with the object.

24. The method of claim 10, wherein the probes are capacitively coupled to the object.

25. The method of claim 10, wherein the object is non-conductive.

26. The method of claim 10, wherein the first frequency is zero Hertz.

27. A modeling method, comprising:

positioning a plurality of probes proximate a periphery of an object;

grouping the plurality of probes into one or more pairs, each pair consisting of a unique combination of two of the probes;

using each pair, measuring a first impedance between the two probes of the pair responsive to a signal applied between the two probes at a first frequency and measuring a first impedance between the two probes of the pair at a second frequency of the signal;

for each pair, determining a first lumped-parameter impedance model for a straight line extending between the two probes of the pair based on the first measured impedances, the first lumped-parameter impedance model including a first capacitance value and a first resistance value;

the modeling method further comprising for each pair, measuring a second impedance between the two probes of the pair responsive to the signal applied between the two probes at the first frequency and measuring a second impedance between the two probes of the pair at the second frequency of the signal, the second impedance measurements being made later in time than the first impedance measurements;

for each pair, determining a second lumped-parameter impedance model for the straight line extending between the two probes of the pair based on the second measured impedances, the second lumped-parameter impedance model including a second capacitance value and a second resistance value;

estimating a first impedance value for a point within the periphery by:

determining orthogonal distances from the point to three or more of the straight lines extending between the probe pairs, the three or more of the straight lines encompassing the point; and calculating a weighted average of impedance values of the first lumped-parameter impedance model associated with each of the three or more straight lines, the impedance values of the first lumped-parameter impedance model of each pair being weighted respectively by the orthogonal distances;

estimating a second impedance value for the point by:

calculating a weighted average of impedance values of the second lumped-parameter impedance model associated with each of the three or more straight lines encompassing the point, the second impedance values of the second lumped-parameter impedance model of each pair being weighted respectively by the orthogonal distances from the point to the three or more straight lines encompassing the point; and determining that the second estimated impedance value is outside of a range associated with the first estimated impedance value.

28. An article of manufacture comprising:

computer-readable media comprising a program configured to cause circuitry to perform processing comprising:

for one or more pairs, each pair consisting of a unique combination of two probes of a plurality of probes, determining a lumped-parameter impedance model for the pair based on measurements of impedance responsive to a signal at a non-zero frequency applied between the two probes of the pair, the probes of the plurality of probes being coupled to a periphery of a near-planar sheet of matter; and estimating an impedance of the near-planar sheet of matter at a point within the periphery based on the lumped-parameter impedance model of each pair, by performing the acts comprising:

for each pair, determining a lumped-parameter impedance model for a straight line extending between the two probes of the pair based on the impedance measurements, the lumped-parameter impedance model including a capacitance value and a resistance value;

determining orthogonal distances from the point to three or more of the straight lines, the three or more of the straight lines encompassing the point; and calculating a weighted average of impedance values of the lumped-parameter impedance model associated with each of the three or more straight lines, the impedance values of each lumped-parameter impedance model being weighted respectively by the orthogonal distances.

29. An impedance-modeling device comprising:

measurement circuitry configured to be coupled to a plurality of probes positioned proximate a periphery of a near-planar sheet of matter and configured to measure impedances responsive to a signal at a non-zero frequency applied between pairs of the plurality probes, each pair consisting of a unique combination of two probes of the plurality of probes; and processing circuitry configured to:
 determine, for each pair, a lumped-parameter impedance model for a straight line extending between the two probes of the pair based on impedance measurements made by the measurement circuitry; and
 estimate an impedance of the near-planar sheet of matter at a point within the periphery based on the lumped-parameter impedance model of each pair;
wherein the estimated impedance comprises a first estimated impedance, and the processing circuitry is further configured to:
 estimate a second impedance of the near-planar sheet of matter at the point within the periphery based on a second set of impedance measurements provided by the measurement circuitry, the measurement circuitry measuring the second set of impedance measurements after measuring the impedances on which the first estimated impedance is based; and
 determine whether the second impedance estimate is outside of a range associated with the first impedance estimate.

30. The estimated impedance monitoring of claim 29, wherein the probes are capacitively coupled to the near-planar sheet of matter.

31. The estimated impedance monitoring of claim 29, wherein the near-planar sheet of matter is non-conductive.

* * * * *

UNITED STATES PATENT AND TRADEMARK OFFICE
CERTIFICATE OF CORRECTION

| | |
|---|---|
| PATENT NO. | : 7,620,507 B2 |
| APPLICATION NO. | : 11/753214 |
| DATED | : November 17, 2009 |
| INVENTOR(S) | : John G. Richardson |

It is certified that error appears in the above-identified patent and that said Letters Patent is hereby corrected as shown below:

In the specification:
COLUMN 11, LINE 8, change "single" to --single portable--

In the claims:
CLAIM 15, COLUMN 13, LINE 27, change "measurement" to --measurements--

Signed and Sealed this
Twenty-sixth Day of February, 2013

Teresa Stanek Rea
*Acting Director of the United States Patent and Trademark Office*